(12) United States Patent
Strickley

(10) Patent No.: US 6,423,910 B1
(45) Date of Patent: Jul. 23, 2002

(54) PRINTED CIRCUIT DEVICE

(75) Inventor: David William Strickley, Birmingham (GB)

(73) Assignee: Lucas Industries Limited, London (GB)

( * ) Notice: Subject to any disclaimer, the term of this patent is extended or adjusted under 35 U.S.C. 154(b) by 0 days.

(21) Appl. No.: 09/457,948

(22) Filed: Dec. 9, 1999

(30) Foreign Application Priority Data

Dec. 23, 1998 (GB) .............................................. 9828490

(51) Int. Cl.[7] .............................. H01R 12/04; H05K 1/11
(52) U.S. Cl. ........................................ 174/262; 174/255
(58) Field of Search ................................ 174/261, 262, 174/263, 264, 265, 266, 267, 250, 255; 29/830

(56) References Cited

U.S. PATENT DOCUMENTS

| | | | | |
|---|---|---|---|---|
| 3,346,950 A | * | 10/1967 | Schick | 29/625 |
| 4,517,050 A | * | 5/1985 | Johnson et al. | 156/643 |
| 4,700,473 A | * | 10/1987 | Freyman et al. | 29/846 |
| H650 H | * | 7/1989 | Lindenmeyer | 174/68.5 |
| 5,127,570 A | * | 7/1992 | Steitz et al. | 228/103 |
| 5,189,261 A | * | 2/1993 | Alexander et al. | 174/263 |
| 5,281,770 A | * | 1/1994 | Kamei et al. | 174/261 |
| 6,232,558 B1 | * | 5/2001 | Tsukada et al. | 174/252 |

FOREIGN PATENT DOCUMENTS

| | | | |
|---|---|---|---|
| EP | 0 312 415 | * | 4/1989 |
| GB | 2320619 A | | 6/1998 |

* cited by examiner

Primary Examiner—Kamand Cuneo
Assistant Examiner—Jeremy Norris
(74) Attorney, Agent, or Firm—Ohlandt, Greeley, Ruggiero & Perle, L.L.P.

(57) ABSTRACT

A printed circuit device comprising, a printed circuit board having an electrically conductive heat plane associated with a surface thereof, the circuit board having an opening formed therein which exposes a ground layer or track of the circuit board, a wall defining the opening being provided with an electrically conductive coating which is electrically connected to the ground layer or track, the heat plane being provided with a cut-out defining a projection which is bent to extend into the opening, the projection being secured to said coating electrically to connect the coating and the ground layer or track to the heat plane. The invention also resides in a method of manufacturing a printed circuit device and in a heat plane for use in such a device.

6 Claims, 1 Drawing Sheet

PRINTED CIRCUIT DEVICE

This invention relates to a printed circuit device including a printed circuit board and a heat plane associated with the board. In particular, the invention relates to a device of the type suitable for carrying electromagnetic compatibility (EMC) filters for removing, for example, high frequency noise currents from the power lines of the device. The invention also relates to a method of producing such a device.

In a known device, for example as described in GB 2320619, a printed circuit board carries circuits which are sensitive to electromagnetic radiation or which generate such radiation, and is provided with a series of openings through which connector elements extend. Each connector element is soldered, at one end, to appropriate tracks provided on or in the circuit board, the other end of each element being shaped for cooperation with a casing to electrically connect the said tracks to the casing. The board may be provided with a heat plane in the form of a copper or other suitable metallic plate which is bonded to a surface of the board and arranged to contact the casing. The heat plane is thus thermally and electrically connected to the casing. In such an arrangement, the heat plane is provided with a series of openings through which the connector elements extend. As a result, there is no direct electrical connection between the connector elements and the heat plane.

It is thought that, in use in applications in which significant levels of vibrations are applied to the device, the vibrations may result in the connector elements becoming abraded, resulting in failure of the device.

It is an object of the invention to provide a printed circuit device of relatively simple and convenient form in which this disadvantage is obviated or mitigated, and to provide a method of producing such a device.

According to the present invention there is provided a printed circuit device comprising a printed circuit board having an electrically conductive heat plane associated with a surface thereof, the circuit board having an opening formed therein which exposes a ground layer or track of the circuit board, a wall defining the opening being provided with an electrically conductive coating which is electrically connected to the ground layer or track, the heat plane being provided with a cut-out defining a projection which is bent to extend into the opening, the projection being secured to the coating to electrically connect the coating and the ground layer or track to the heat plane.

As the electrical connections to the ground layer or track are achieved through the parts of the heat plane which form the projections, and as the heat plane is of a relatively robust form, the risk of abrasion may be reduced.

The heat plane is conveniently provided with a plurality of such cut-outs defining a plurality of projections, each projection extending into a respective opening provided in the circuit board to form an electrical connection between the ground layer and the heat plane.

The or each projection is conveniently secured to the or a respective one of the coatings by soldering, for example using a wave soldering technique.

The heat plane conveniently takes the form of a metallic plate, for example a copper plate, an aluminum plate or a plate of steel, molybdenum or invar.

The invention also relates to a method of producing such a device comprising the steps of forming a cut-out in a heat plane, positioning the heat plane adjacent a printed circuit board such that a projection defined by the cut-out overlies a coated opening provided in the circuit board, the coating of the opening being electrically connected to a ground layer or track of the circuit board, deforming the heat plane to push the projection into the opening, and securing the projection to the coating of the opening to form an electrical connection between the ground layer or track of the circuit board and the heat plane.

According to another aspect of the invention there is provided a heat plane for use in such a device, the heat plane being provided with a cut-out definina projection.

The invention will further be described, by way of example, with reference to the accompanying drawings, in which.

Figure 1:
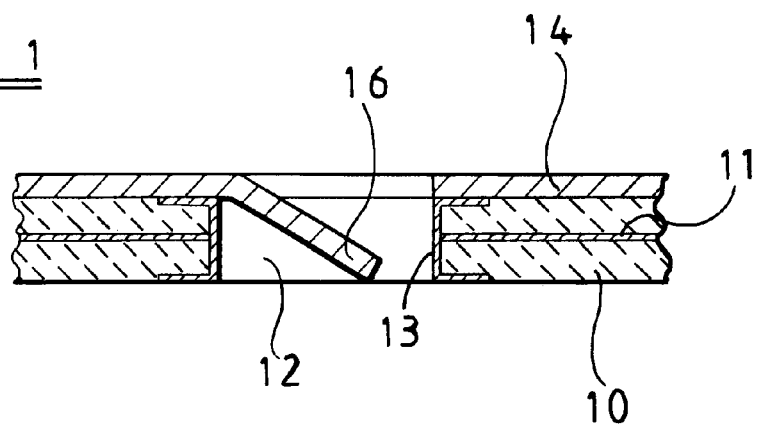
FIG. 1 is a sectional view of part of a printed circuit device in accordance with an embodiment.
Figure 2:
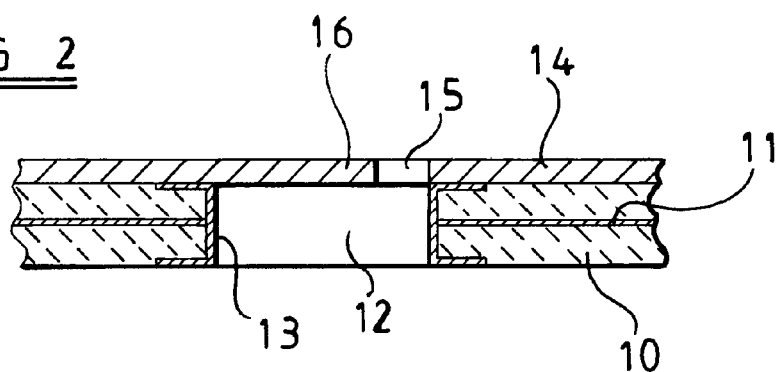
FIG. 2 is a view of the device of FIG. 1 prior to deformation of the heat plane.

The printed circuit device illustrated in FIG. 1 comprises a printed circuit board 10 of the multilayer type, the board 10 including an internal ground layer 11. The board is provided with a plurality of openings 12 (only one of which is shown) and it will be appreciated that the ground layer 11 is exposed by the openings 12. In the event that the ground layer 11 is not continuous, then it will be appreciated that the location of the openings 12 and/or the shape of the ground layer 11 should be chosen to ensure that the openings 12 expose parts of the layer 11. The walls defining each of the openings together with the adjacent parts of the upper and lower surfaces of the circuit board 10 are provided with a coating 13 of an electrically conductive material, for example copper, the coating 13 being electrically connected to the ground layer 11.

Although in the arrangement described, the coating 13 is connected to an internal ground layer 11, it will be appreciated that the invention is also applicable to arrangements in which the coating is electrically connected to a surface ground track.

Figure 3:
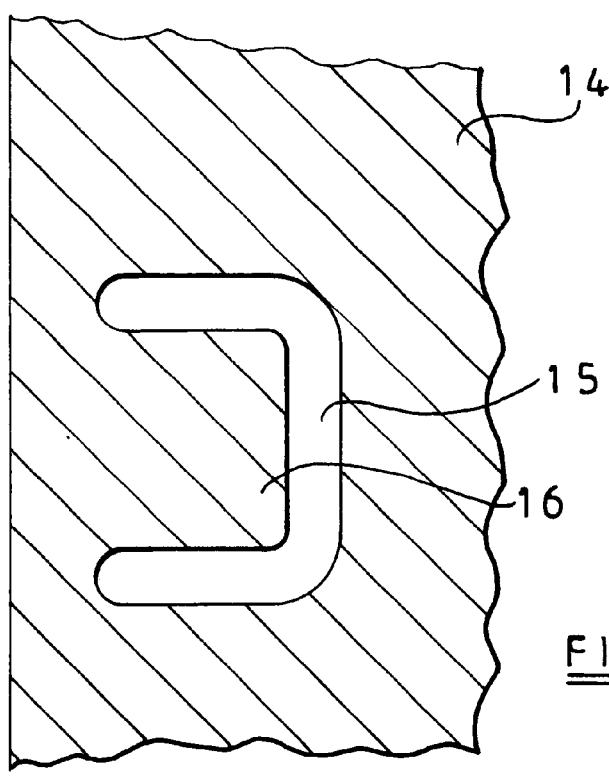
FIG. 3 is a plan view of part of the device shown in FIG. 2.

A heat plane 14 in the form of a copper plate is bonded to the upper surface of the circuit board 10, in the orientation illustrated. The heat plane 14 is intended to act as a heat sink to allow heat generated by some of the electronic or electrical components mounted upon the circuit board 10 to be transmitted, by radiation or by conduction, to the casing within which the device is housed. Prior to being bonded to the circuit board 10, the heat plane 14 was machined to form a series of cut-outs 15 therein. The cut-outs 15 take the form illustrated in FIG. 3. As shown in FIG. 3, each cut-out 15 is of C- or U-shape and defines a projection 16. The location of the heat plane 14 on the circuit board 10 is such as to ensure that each of the cut-outs 15 and projections 16 is aligned with a corresponding one of the openings 12. Conveniently, the openings 12 are slightly larger than the projections 16 to allow for slight misalignments occurring during assembly of the device. As shown in FIG. 1, after being correctly positioned, the heat plane 14 is deformed to push each of the projections 16 into or through the respective opening 12. The deformation conveniently results in the free end of each projection 16 lying flush with the surface of the circuit board 10 remote from the surface to which the heat plane 14 is bonded. It will be appreciated that the angle through which each projection 16 is bent during the deformation operation is dependent upon the thickness of the circuit board 10 and the length of each projection 16.

After the step of deforming the heat plane 14 has been completed, the end of each projection 16 remote from the major part of the heat plane 14 is soldered or otherwise electrically connected to the coating 13 of the respective opening 12. This can be achieved at the same time as the various electrical or electronic components which are to be electrically connected to the circuit board are secured thereto, for example using a wave-soldering technique. By arranging for the end of each projection 16 to lie flush with the surface of the circuit board 10, the quantity of solder used to connect each projection 16 to the coating 13 can be optimized. Further, the ends of the projections 16 do not interfere with the mounting of components upon the circuit board 10. However, if the ends of the projections do not lie exactly flush with the surface of the circuit board, then this may be tolerated.

In order to assist in achieving a good electrical contact, the projections 16 are conveniently provided with a solderable finish. For example, copper heat planes are conveniently provided with nickel and gold coatings, and aluminum heat planes are conveniently tin plated.

After the printed circuit device has been produced, it can be installed in an appropriate electrically grounded casing and electrical connections are made between the casing and the heat plane 14. Where the heat plane 14 is intended to conduct heat to the casing rather than rely upon radiation alone, then the heat plane 14 is conveniently arranged to lie against a wall of the casing.

It will be appreciated that, as is commonplace in the technology of printed circuit devices, electrical or electronic devices may be mounted upon either or both sides of the board 10. If components are to be mounted upon the side of the board 10 provided with the heat plane 14, then the heat plane is provided with appropriate openings to permit electrical connections to be made between the conductive tracks of the circuit board and the components whilst ensuring that the heat plane 14 remains electrically insulated from the tracks and components of the device. In such an arrangement, the cut-outs 15 are conveniently formed in the same operation as the machining of the openings through which the connections are made. The cut-outs 15 may be formed, for example, by drilling, punching, routing or chemical machining.

The openings 12 and projections 16 are conveniently located in the optimum positions for EMC grounding. It will be appreciated that the actual positions will depend upon the nature of the circuits carried by the circuit board and the layout of the circuits. Where the circuit board is of the multilayer type, it will be understood that there may be several ground layers, and that the ground layers may be associated with independent parts of the circuit carried by the board. If desired, the individual ground layers may be connected to the heat plane independently of one another using separate projections 16 and openings 12.

I claim:

1. A printed circuit device comprising: a printed circuit board having an electrically conductive heat plane associated with a surface thereof, the circuit board having an opening formed therein which exposes a ground layer or track of the circuit board, a wall defining the opening being provided with an electrically conductive coating formed separately from said heat plane and electrically connected to said ground layer or track, the heat plane being provided with a cut-out having a closed peripheral edge and defining a projection which is bent to extend from said peripheral edge into the opening, the projection being secured to said coating whereby said projection electrically connects said coating and said ground layer or track to said heat plane.

2. A printed circuit device as claimed in claim 1, wherein said heat plane is provided with a plurality of cut-outs each defining a respective projection, each projection extending into a respective opening provided in the circuit board to form an electrical connection between the ground layer or track and the heat plane.

3. A printed circuit device as claimed in claim 1, wherein said projection is secured to said coating by soldering.

4. A printed circuit device as claimed in claim 1, wherein said heat plane takes the form of a metallic plate.

5. A printed circuit device as claimed in claim 4, wherein said heat plane is formed from one of, copper, aluminum, steel, molybdenum or invar.

6. A method of producing a printed circuit device that includes a printed circuit board having an opening, the opening having a coating that is electrically connected to a ground layer or track of the circuit board, said method comprising the steps of forming a cut-out in a heat plane, then positioning the heat plane adjacent the printed circuit board such that a projection defined by the cut-out overlies the coated opening provided in the circuit board, deforming the heat plane to push the projection into the opening, and securing the projection to the coating of the opening to form an electrical connection between the ground layer or track of the circuit board and the heat plane.

* * * * *